(12) United States Patent
Kang et al.

(10) Patent No.: US 10,104,792 B2
(45) Date of Patent: Oct. 16, 2018

(54) ANTI-SLIP SUBSTRATES

(71) Applicant: HEWLETT-PACKARD DEVELOPMENT COMPANY, L.P., Houston, TX (US)

(72) Inventors: Yu-Chuan (Tony) Kang, Taipei (TW); Kuan-Ting Wu, Taipei (TW)

(73) Assignee: Hewlett-Packard Development Company, L.P., Houston, TX (US)

( * ) Notice: Subject to any disclaimer, the term of this patent is extended or adjusted under 35 U.S.C. 154(b) by 188 days.

(21) Appl. No.: 15/021,457

(22) PCT Filed: Oct. 31, 2013

(86) PCT No.: PCT/US2013/067700
§ 371 (c)(1),
(2) Date: Mar. 11, 2016

(87) PCT Pub. No.: WO2015/065414
PCT Pub. Date: May 7, 2015

(65) Prior Publication Data
US 2016/0227656 A1    Aug. 4, 2016

(51) Int. Cl.
*H05K 5/02* (2006.01)
*A45C 11/00* (2006.01)
*A45F 5/00* (2006.01)
*C25D 13/06* (2006.01)
*C25D 13/12* (2006.01)
*C25D 13/20* (2006.01)

(52) U.S. Cl.
CPC .............. *H05K 5/02* (2013.01); *A45C 11/00* (2013.01); *A45F 5/00* (2013.01); *C25D 13/06* (2013.01); *C25D 13/12* (2013.01); *C25D 13/20* (2013.01); *H05K 5/0243* (2013.01); *A45C 2011/002* (2013.01); *A45C 2011/003* (2013.01)

(58) Field of Classification Search
CPC ......................................................... A45F 5/00
See application file for complete search history.

(56) References Cited

U.S. PATENT DOCUMENTS

2008/0251512 A1* 10/2008 Griffin ................... A45C 11/00
                                                                    220/4.02
2009/0068428 A1*  3/2009 Shinoda ................. B29B 11/16
                                                                    428/212

(Continued)

FOREIGN PATENT DOCUMENTS

JP        3153409        9/2009
JP        3178230        9/2012

(Continued)

OTHER PUBLICATIONS

"HTC Evo 3D Review", < http://reviews.cnet.co.uk/mobile-phones/htc-evo-3d-review-50004232/ >, Aug 12, 2011.

(Continued)

*Primary Examiner* — Xiao S Zhao
(74) *Attorney, Agent, or Firm* — HPI Patent Department

(57) ABSTRACT

A method is provided for modifying a layer of a plastics material containing conductive fibers. The method includes electrophoretically depositing a bead of a polymer material at locations of a surface of the layer where the conductive fibers are exposed.

7 Claims, 4 Drawing Sheets

(56) References Cited

U.S. PATENT DOCUMENTS

| | | | |
|---|---|---|---|
| 2012/0231707 A1* | 9/2012 | Pahl | B24D 3/346 451/59 |
| 2012/0279877 A1 | 11/2012 | Janis et al. | |
| 2013/0081962 A1 | 4/2013 | Cohen | |
| 2015/0295615 A1* | 10/2015 | Smith | A45C 5/02 455/575.8 |

FOREIGN PATENT DOCUMENTS

| | | |
|---|---|---|
| JP | 2012/214946 | 11/2012 |
| KR | 10-0477269 | 3/2005 |
| KR | 10-1079452 | 11/2011 |
| WO | WO-2013120287 A1 | 8/2013 |

OTHER PUBLICATIONS

"Red Anti-stip Back Battery Door Cover for Blackberry 9000 Cell Phone Cases", http://www.ebanggood.com, Retrieved on Oct 8, 2013.

"Samsung Galaxy Xcover 2 Review: Gone Fishing", http://gsmarena.com/samsung_s7710_galaxy_xcover_2-review-892p2.php, Feb. 23, 2013.

Makwana, "Lenovo S560 and Lanovo P700i", http://www.themobileindian.com/news/9179_Hands-on:-Lenovo-S560-and-Lenovo-P700l, Nov. 6, 2012.

\* cited by examiner

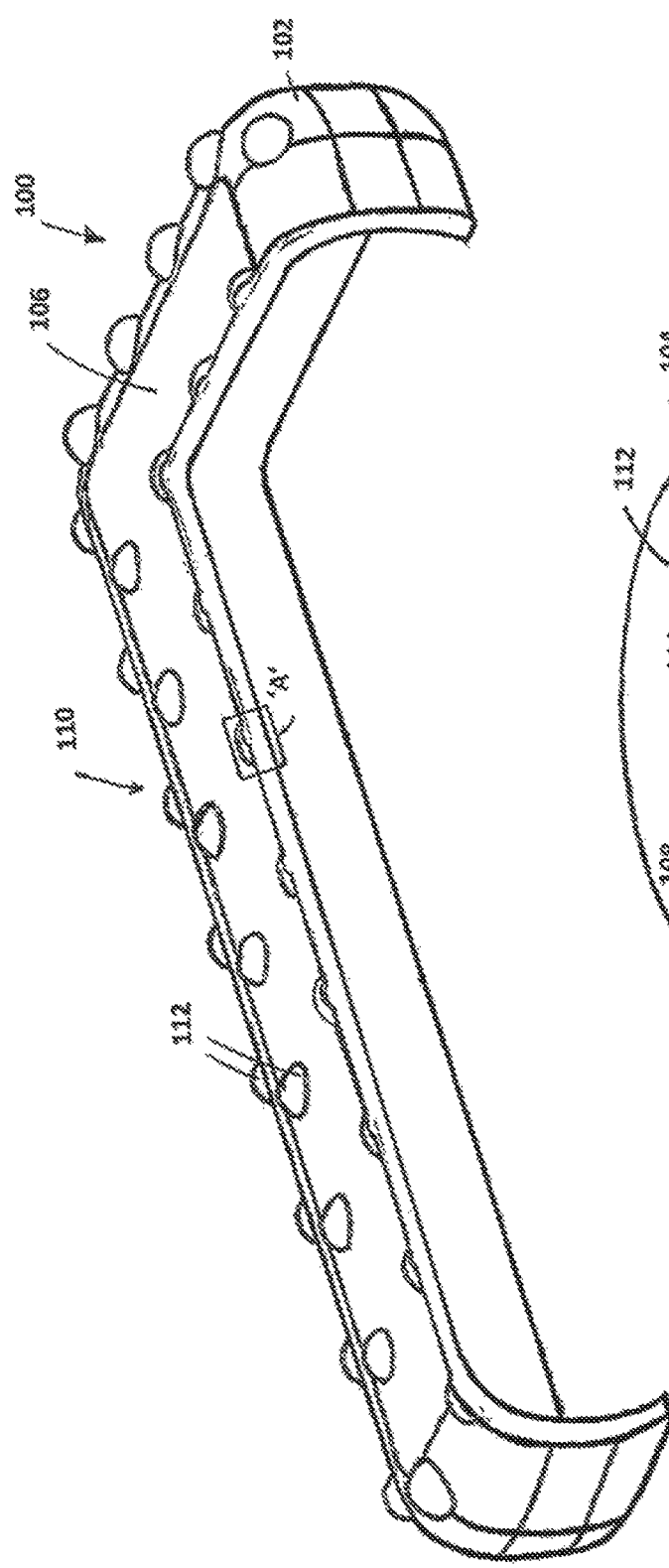
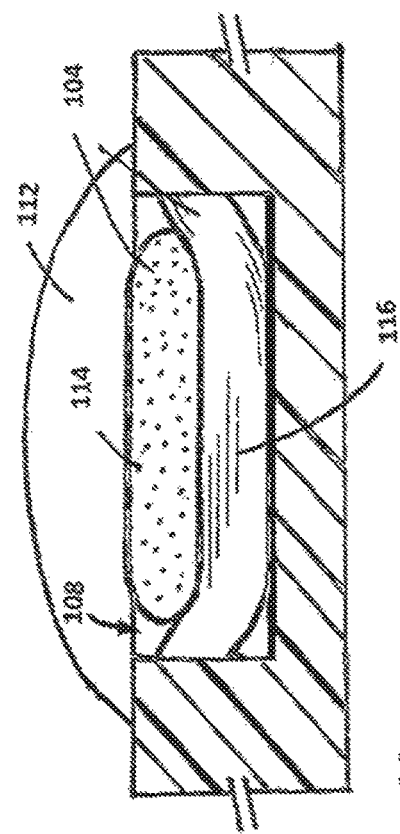
Figure 1B
Figure 1C

ANTI-SLIP SUBSTRATES

BACKGROUND

Devices such as mobile phones, tablets and portable (e.g. laptop or palm) computers are generally housed in a smooth shell of plastics or metal material.

However, the shell of a device may be slippery to handle particularly if a user's hands are moist and may slide on an inclined surface. Accordingly a secondary market has developed for non-slip or protective cases.

BRIEF DESCRIPTION OF DRAWINGS

The disclosure is described by way of non-limiting examples with reference to the accompanying drawings, in which:

FIG. 1B shows a perspective view of the housing of FIG. 1 with a part of the housing cut away;

FIG. 1C shows, on an enlarged scale, a part of the housing of FIG. 1 labelled 'A' in FIG. 1B of the drawings;

DETAILED DESCRIPTION

On a aspect of the disclosure relates to a method of modifying a layer of a plastics material containing conductive fibers. The method includes electrophoretically depositing a bead of a polymer material at locations of a surface of the layer where the conductive fibers are exposed. The beads impart a slip resistant finish to the surface of the layer.

Another aspect of the disclosure relates to a method of manufacturing a shell of a housing for a device. The method includes providing a shell of a plastics material containing conductive fibers which are exposed at spaced apart locations of a surface of the shell. Beads of polymer material are electrophoretically deposited on the surface of the shell at the locations of the surface of the shell. The beads impart a slip resistant finish to the surface of the shell.

Yet a further aspect of the disclosure relates to a housing for a device. The housing includes a fiber reinforced plastics shell including conductive fibers. The shell defines a surface and the conductive fibers are exposed at spaced apart locations of the surface of the shell. A slip resistant finish is carried by the surface of the shell, the slip resistant finish comprising electrophoretically deposited polymer material arranged at the locations of the shell.

In this specification, the term "electrophoretic deposition" is to be understood to include any deposition technique whereby charged particles in suspension are deposited on an electrically conductive substrate under the influence of an electric field.

Figure 1A:
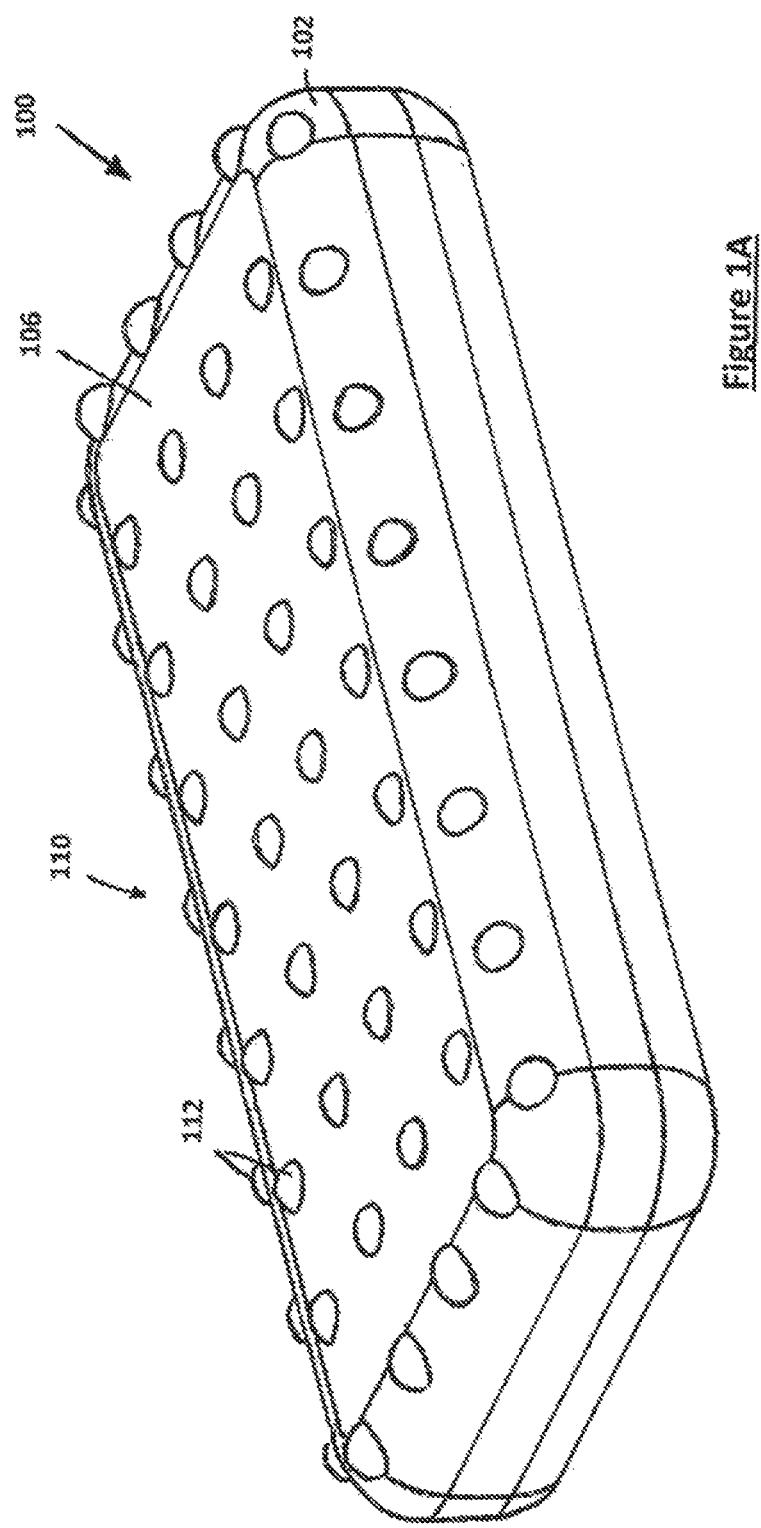
FIG. 1A shows a perspective view of an example of a housing for a device.

FIGS. 1A to 1C illustrate an example of a housing 100 for a device. The housing 100 includes a fiber reinforced shell 102 of a plastics material including conductive fibers 104 (FIG. 1C). The shell 102 defines a surface 106. The conductive fibers 104 are exposed at spaced apart locations 108 (one of which is illustrated in FIG. 1C) of the surface 106 of the shell 102.

A slip resistant finish 110 is applied to the surface 106 of the shell 102. The slip resistant finish 110 comprises beads 112 of electrophoretically deposited polymer material. The beads 112 are deposited on the surface 106 of the shell 102 at the locations 108 effectively to cover the exposed conductive fibers 104.

The housing 100 is intended for portable devices such as mobile phones, tablet or portable (laptop, notebook or palm) computers, printers, scanners, watches, cameras, glasses, or the like. The plastics material from which the shell 102 is made is one of a thermoplastics and a thermosetting plastics material depending on the application of the housing 100.

As described above, the shell 102 is a fiber reinforced shell which is reinforced by the conductive fibers 104. The fibers are carbon fibers. In the illustrated examples, the fibers are arranged in the plastics material in a weave having intersecting or crossing threads 114 and 116. Instead, the fibers 104 could be uni-directionally arranged in the shell 102.

At least in some of the examples, the positions where the threads 114, 116 cross create the exposed locations 108 of the surface 106 of the shell 102.

The polymer material used in the electrophoretic deposition of the beads 112 is at least one of epoxy and polyacrylate polymers. While the beads 112 have been illustrated as semispherical in shape, this is for illustrative purposes only. The beads 112 could have other shapes such as concave, polygonal, pyramidal, oval, or any other desired shapes. Appropriate application techniques are used to control the formation of the beads to provide the required shapes. These application techniques include screen printing, film transfers, ink transfer, inkjet printing, or the like.

Further, the beads 112 are able to be deposited on the surface 106 of the shell to form a pattern on the shell 102. For example, the pattern could define a logo or other device. In addition, the polymer material used for the beads 112 could be of different colors to provide suitable patterning, etc.

Figure 2A:
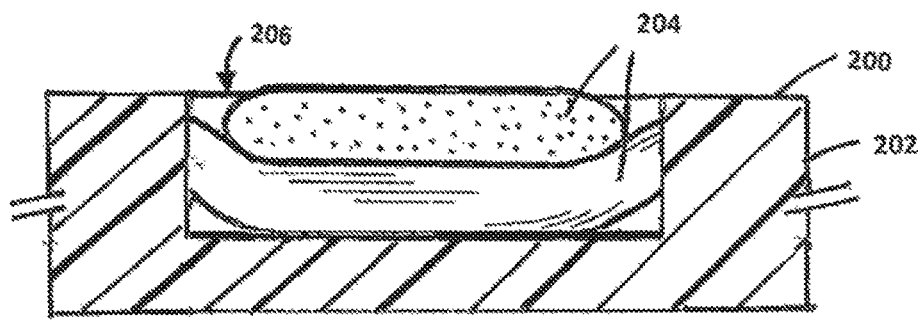
FIG. 2A shows a sectional view of a stage of an example of a method of forming s slip resistant finish on a surface of a layer of a plastics material containing conductive fibers.
Figure 2B:
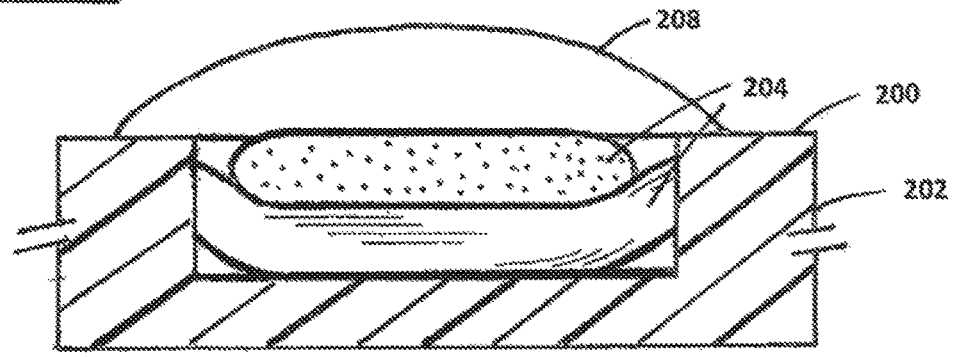
FIG. 2B shows a sectional view of a further stage of the method of FIG. 2A.

With reference to FIGS. 2A and 2B, two stages of an example of a method of forming a slip resistant finish on a surface 200 of a layer 202 of a plastics material is illustrated. The layer 202 of plastics material is reinforced with conductive fibers 204 arranged in a weave configuration. Points where the conductive fibers 204 cross define exposed locations 206 (one of which is illustrated in FIGS. 2A and 2B) in the surface 200 of the layer 202.

A bead 208 of a polymer material is deposited using electrophoretic deposition and relying on the conductivity of the conductive fibers 204 of the layer 202 of plastics material. Each bead 206 overlies the crossing point of the fibers 204 effectively to close off its associated exposed location 206 of the layer 202. The beads 208 together define the slip resistant finish on the surface 200 of the layer 202.

Figure 3A:
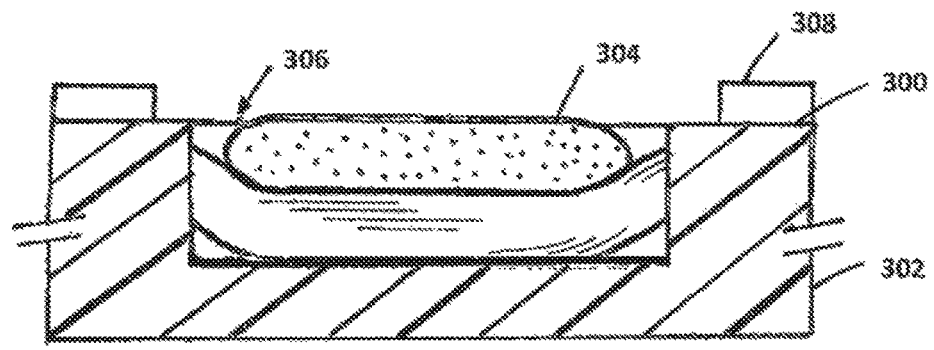
FIG. 3A shows a sectional view of a stage of another example of a method of forming a slip resistant finish on a surface of a layer of a plastics material containing conductive fibers.
Figure 3B:
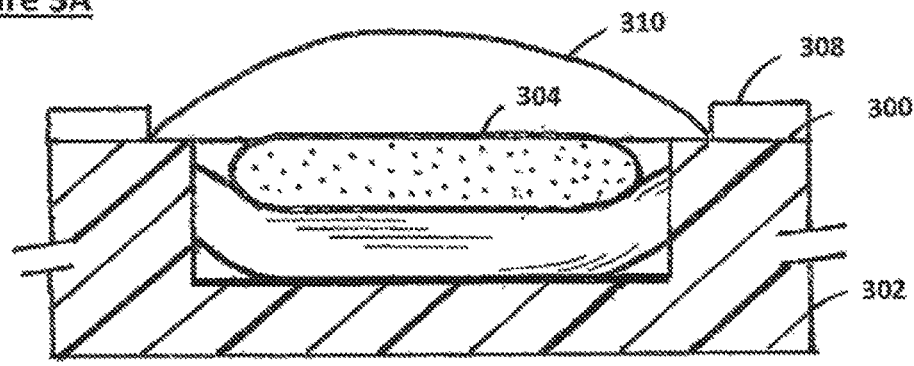
FIG. 3B shows a sectional view of a further stage of the method of FIG. 3B.

FIGS. 3A and 3B of the drawings illustrate two stages of another example of a method of forming a slip resistant finish on a surface 300 of a layer 302 of a plastics material. The layer 302 of plastics material is reinforced with conductive fibers 304 arranged in a weave configuration.

An insulating mask 308 is applied to the surface 300 of the layer 302 of plastics material. The surface 300 of the layer 302 is then worked by etching it to form exposed locations 306 (one of which is shown in FIGS. 3A and 3B) in the surface 300 of the layer 302. The etching technique used is laser etching, chemical etching, or the like.

A bead 310 of polymer material is deposited using electrophoretic deposition at each exposed location 306 of the layer 302 to define the slip resistant finish on the surface 300 of the layer 302.

Depending on the material used to form the layer 302 as well as the application of the layer 302, the insulating mask 308 can either be left in position on the layer 302 or it can be removed prior co the completion of the finished product made from the layer 302.

Figure 4A:
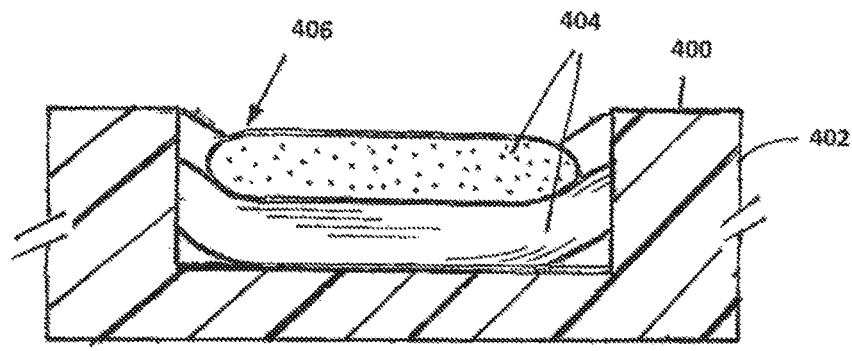
FIG. 4A shows a sectional view of a stage of yet another example of a method of forming a slip resistant finish on a surface of a layer of a plastics material containing conductive fibers.
Figure 4B:
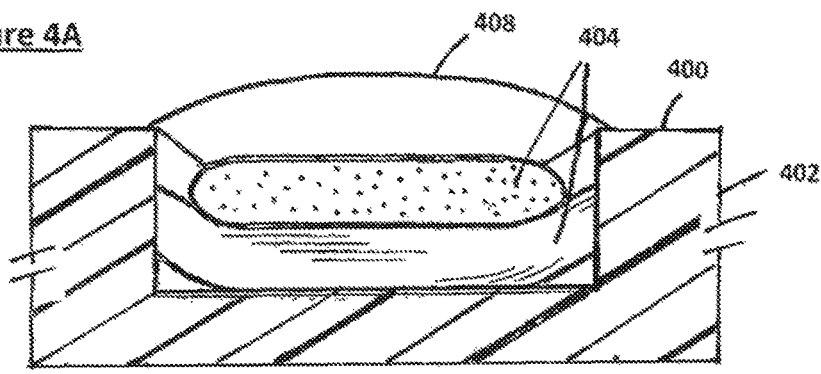
FIG. 4B shows a sectional view of a further stage of the method of FIG. 4A.

FIGS. 4A and 4B of the drawings illustrate two stages of yet another example of a method of forming a slip resistant finish on a surface 400 of a layer 402 of a plastics material. The layer 402 of plastics material is reinforced with conductive fibers 404 arranged in a weave configuration.

In this example, the surface 400 of the layer 402 is worked to expose the conductive fibers 404 at locations 406 (one of which is shown in FIGS. 4A and 4B). The surface 400 is worked by an etching technique, an abrading technique, or the like to expose the conductive fibers 404 at the locations 406.

A bead 408 of polymer materiel is deposited using electrophoretic deposition at each exposed location 406 of the layer 402 to define the slip resistant finish on the surface 400 of the layer 402.

Figure 5:
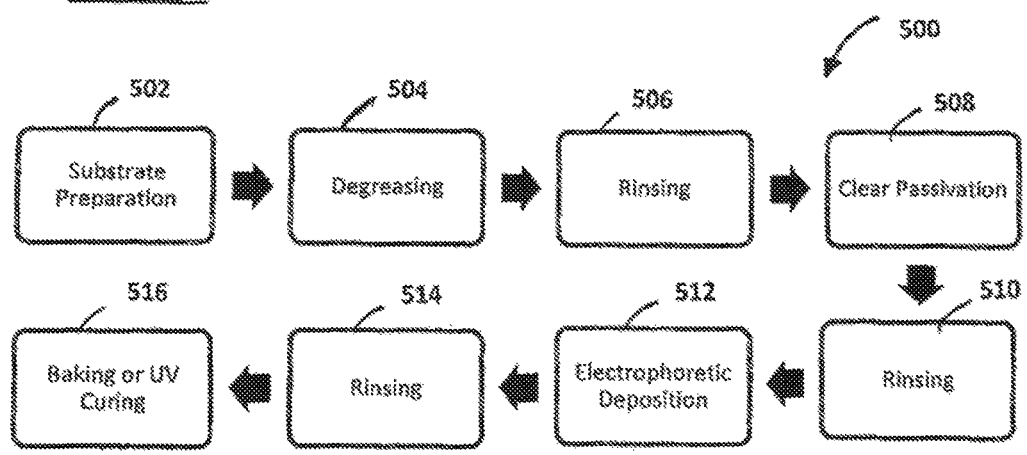
FIG. 5 shows a flow chart of an example of a method of forming a slip resistant finish on a surface of a layer of a plastics material containing conductive fibers.

Referring to FIG. 5 of the drawings, a flow chart of the method of forming a slip resistant, finish on a surface of layer of a plastics material is illustrated and is designated generally by reference numeral 500.

At 502, a substrate comprising a layer of conductive fiber reinforced plastics material is prepared. This preparation step optionally includes forming the layer into a shell to be used as a housing for a device. Alternatively the layer may have been pre-formed into the shell and is supplied to have the slip resistant finish applied.

At 504, the substrate undergoes a degreasing process using a degreasing agent followed, at 506, by an initial rinsing process to remove the degreasing agent. Deionized water is used in the rinsing process using ultrasonics.

Passivation of the substrate is carried out at 508. The passivation agent used is a water based chemical passivation agent. A suitable passivation agent is available from Akamizu of No. 51, Ln. 293, Sec. 1, Singnong Rd., Beidou Township, Changhua County 52141, Taiwan (R.O.C.).

After passivation, the substrate undergoes a further rinsing process, as shown at 510, to remove excess passivation agent. Rinsing is, once again, carried out using deionized water in an ultrasonic machine.

At 512, electrophoretic deposition is carried out to deposit beads of polymeric material on to the surface of the substrate at locations of the substrate where conductive fibers of the substrate have been exposed. The deposition of the beads provides the slip resistant finish to the surface of the substrate.

After deposition of the slip resistant finish, the substrate is again rinsed, as shown at 514, to remove excess deposited polymeric material. This rinsing is also carried out using deionized water in an ultrasonic machine.

Finally, as shown at 516, the substrate undergoes a baking or ultraviolet curing process to set the deposited beads defining the slip resistant finish. When a baking process of the substrate takes place, this is effected in an oven at a temperature of not less than 120° C., not exceeding 180° C. and, more particularly, at about 170° C.

As described above, the electrophoretically deposited beads of the slip resistant finish 110 could be arranged in a decorative pattern and the beads may have different colors and/or textures. Thus, housings can be formed having logos, letters, numbers, symbols and other patterns on them. The beads 112 can be of different colors from one another and from the color of the shell 102 itself to provide an attractive visual appearance.

The provision of the slip-resistant finish 110 on the shell 102 also imparts a tactile feel to the shell 102 and may also have health benefits as it could be anti-bacterially treated.

It is an advantage of the described examples that a method is provided which imparts a slip resistant finish to a housing in a cost effective and efficient manner. Electrophoretic deposition results in a reduced manufacturing cycle time and reduced labor input with the associated cost savings. There are also fewer processing steps which leads to energy savings and reduced emission of carbon-based pollutants.

Numerous variations and/or modifications may be made to the above-described examples, without departing from the broad general scope of the present disclosure. For example, while the plastics material of the layer or shell is illustrated as including one layer only, the plastics material may comprise multiple layers arranged in a laminate. Still further, while the polymer material is shown on one side of the substrate only, the electrophoretically deposited material, may be applied to more than one side and/or around the entire plastics material. The present examples are, therefore, to be considered in all respects as illustrative and not restrictive.

The invention claimed is:

1. A housing for a device, the housing comprising:
   a fiber reinforced plastics shell including conductive fibers, the fiber reinforced plastics shell defining a surface and the conductive fibers being exposed via openings at spaced apart locations of the surface of the fiber reinforced plastics shell; and
   a slip resistant finish applied to the surface of the fiber reinforced plastics shell, the slip resistant finish comprising electrophoretically deposited polymer material arranged at the openings of the spaced apart locations of the fiber reinforced plastics shell where the conductive fibers are exposed.

2. The housing of claim 1, in which the slip resistant finish comprises discrete beads of the polymer material, the beads being deposited at the openings of the spaced apart locations of the fiber reinforced plastics shell.

3. The housing of claim 1, in which the electrophoretically deposited polymer material comprises at least one of epoxy and polyacrylate polymers.

4. The housing of claim 1, in which the plastics material is at least one of a thermoplastic and a thermosetting material.

5. The housing of claim 1, in which the conductive fibers comprise carbon fibers.

6. The housing of claim 1, in which the conductive fibers are arranged in a weave and the locations of the surface of the fiber reinforced plastics shell where the conductive fibers are exposed are regions where threads of the weave cross.

7. The housing of claim 1, in which the conductive fibers are uni-directionally arranged in the fiber reinforced plastics shell.

\* \* \* \* \*